United States Patent
Ilkbahar et al.

(10) Patent No.: US 7,545,689 B2
(45) Date of Patent: *Jun. 9, 2009

(54) METHOD AND APPARATUS FOR IMPROVING YIELD IN SEMICONDUCTOR DEVICES BY GUARANTEEING HEALTH OF REDUNDANCY INFORMATION

(75) Inventors: Alper Ilkbahar, San Jose, CA (US); Derek J. Bosch, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 11/894,861

(22) Filed: Aug. 21, 2007

(65) Prior Publication Data

US 2007/0291563 A1    Dec. 20, 2007

Related U.S. Application Data

(62) Division of application No. 11/024,516, filed on Dec. 28, 2004, now Pat. No. 7,277,336.

(51) Int. Cl.
    *G11C 7/00* (2006.01)
(52) U.S. Cl. .................. 365/200; 365/185.09
(58) Field of Classification Search .......... 365/200, 365/185.09
    See application file for complete search history.

(56) References Cited

U.S. PATENT DOCUMENTS 4,646,266 A    2/1987    Ovshinsky et al.

(Continued)

FOREIGN PATENT DOCUMENTS

GB    2 265 031    9/1993

(Continued)

OTHER PUBLICATIONS

Zhang et al., "On-state reliability of amorphous silicon antifuses," IEDM Digest of Technical Papers, pp. 551-554, 1995.

(Continued)

*Primary Examiner*—Huan Hoang
*Assistant Examiner*—Anthan T Tran
(74) *Attorney, Agent, or Firm*—Brinks Hofer Gilson & Lione

(57) ABSTRACT

A method is provided comprising reading a set of memory cells indicating whether stored redundancy information is reliable and, if the set of memory cells indicates that the stored redundancy information is reliable, determining whether to read primary memory or redundant memory based on the stored redundancy information. Another method is provided comprising reading a set of memory cells associated with a group of memory cells in a primary memory, the set of memory cells indicating whether data can be reliably stored in the group of memory cells; if the set of memory cells indicates that data can be reliably stored in the group of memory cells, storing data in the group of memory cells; and if the set of memory cells does not indicate that data can be reliably stored in the group of memory cells, storing data in a group of memory cells in a redundant memory. In another preferred embodiment, a method for providing memory redundancy is provided.

9 Claims, 8 Drawing Sheets

U.S. PATENT DOCUMENTS

| | | | |
|---|---|---|---|
| 5,130,777 | A | 7/1992 | Galbraith et al. |
| 5,278,839 | A | 1/1994 | Matsumoto et al. |
| 5,313,425 | A | 5/1994 | Lee et al. |
| 5,432,729 | A | 7/1995 | Carson et al. |
| 5,469,450 | A | 11/1995 | Cho et al. |
| 5,498,979 | A | 3/1996 | Parlour et al. |
| 5,579,265 | A | 11/1996 | Devin |
| 5,642,318 | A | 6/1997 | Knaack et al. |
| 5,701,267 | A | 12/1997 | Masuda et al. |
| 5,708,667 | A | 1/1998 | Hayashi |
| 5,748,545 | A | 5/1998 | Lee et al. |
| 5,751,647 | A | 5/1998 | O'Toole |
| 5,757,700 | A | 5/1998 | Kobayashi |
| 5,784,391 | A | 7/1998 | Konigsburg |
| 5,796,694 | A | 8/1998 | Shirane |
| 5,831,989 | A | 11/1998 | Fujisaki |
| 5,835,396 | A | 11/1998 | Zhang |
| 5,835,509 | A | 11/1998 | Sako et al. |
| 5,872,790 | A | 2/1999 | Dixon |
| 5,909,049 | A | 6/1999 | McCollum |
| 5,920,502 | A * | 7/1999 | Noda et al. ............ 365/185.09 |
| 5,943,254 | A | 8/1999 | Bakeman, Jr. et al. |
| 5,986,950 | A | 11/1999 | Joseph |
| 6,016,269 | A | 1/2000 | Peterson et al. |
| 6,026,476 | A | 2/2000 | Rosen |
| 6,034,882 | A | 3/2000 | Johnson et al. |
| 6,055,180 | A | 4/2000 | Gudesen et al. |
| 6,185,122 | B1 | 2/2001 | Johnson et al. |
| 6,205,564 | B1 | 3/2001 | Kim et al. |
| 6,216,247 | B1 | 4/2001 | Creta et al. |
| 6,236,587 | B1 | 5/2001 | Gudesen et al. |
| 6,407,953 | B1 | 6/2002 | Cleeves et al. |
| 6,420,215 | B1 | 7/2002 | Knall et al. |
| 6,438,044 | B2 * | 8/2002 | Fukuda ....................... 365/200 |
| 6,446,242 | B1 | 9/2002 | Lien et al. |
| 6,462,988 | B1 | 10/2002 | Harari |
| 6,487,749 | B1 * | 12/2002 | Tsui ........................... 15/262 |
| 6,498,749 | B1 | 12/2002 | Cuppens et al. |
| 6,515,923 | B1 | 2/2003 | Cleeves |
| 6,525,953 | B1 | 2/2003 | Johnson |
| 6,545,501 | B1 | 4/2003 | Bailis et al. |
| 6,567,287 | B2 | 5/2003 | Scheuerlein |
| 6,574,145 | B2 | 6/2003 | Kleveland et al. |
| 6,591,394 | B2 | 7/2003 | Lee et al. |
| 6,597,595 | B1 * | 7/2003 | Ichiriu et al. .................. 365/49 |
| 6,658,438 | B1 | 12/2003 | Moore et al. |
| 6,661,730 | B1 | 12/2003 | Scheuerlein et al. |
| 6,728,126 | B1 | 4/2004 | Issaq et al. |
| 6,728,149 | B2 | 4/2004 | Akamatsu |
| 6,868,022 | B2 | 3/2005 | Scheuerlein et al. |
| 2002/0028541 | A1 | 3/2002 | Lee et al. |
| 2002/0085431 | A1 | 7/2002 | Jeon et al. |
| 2002/0162062 | A1 | 10/2002 | Hughes et al. |
| 2003/0021176 | A1 | 1/2003 | Hogan |
| 2003/0115514 | A1 | 6/2003 | Ilkbahar et al. |
| 2003/0115518 | A1 * | 6/2003 | Kleveland et al. ........... 714/718 |
| 2003/0120858 | A1 | 6/2003 | March et al. |
| 2004/0100831 | A1 | 5/2004 | Knall et al. |
| 2004/0255089 | A1 * | 12/2004 | Unno ........................ 711/154 |
| 2005/0078537 | A1 | 4/2005 | So et al. |
| 2006/0140026 | A1 | 6/2006 | Ilkbahar et al. |

FOREIGN PATENT DOCUMENTS

| | | |
|---|---|---|
| WO | WO 99/14763 | 8/1998 |

OTHER PUBLICATIONS

Shih et al., "Characterization and modeling of a highly reliable metal-to-metal antifuse for high-performance and high-density field-programmable gate arrays," Proceedings of IEEE, Int. Reliability Physics Symp., 1997, pp. 25-33.

"A 16Mb Mask ROM with Programmable Redundancy," Nsruka et al., ISSCC 1989/Session 10: Nonvolatile Memories/Paper THAM 10.1, 2 pages, Feb. 16, 1989.

"Circuit Technologies for 16Mb DRAMs," Mano et al., ISSCC 1987/Session I: MEGABIT DRAMs/Paper WAM 1.6, 2 pages, Feb. 27, 1987.

"Memory Device and Method for Storing and Reading Data in a Write-Once Memory Array," U.S. Appl. No. 09/877,720, filed Jun. 8, 2001; inventors: Christopher S. Moore, James E. Schneider, J. James Tringali and Roger W. March.

"Memory Device and Method for Storing and Reading a File System Structure in a Write-Once Memory Array," U.S. Appl. No. 09/877,719, filed Jun. 8, 2001; inventors: Christopher S. Moore, James E. Schneider, J. James Tringali and Roger W. March.

"Method for Reading Data in a Write-Once Memory Device Using a Write-Many File System," U.S. Appl. No. 09/818,138, filed Jun. 8, 2001; inventors: J. James Tringali, Christopher S. Moore, Roger W. March, James E. Schneider, Derek Bosch, and Daniel C. Steere.

"Method for Re-Directing Data Traffic in a Write-Once Memory Device," U.S. Appl. No. 09/877,691, filed Jun. 8, 2001; inventors: J. James Tringali, Christopher S. Moore, Roger W. March, James E. Schneider, Derek Bosch, and Daniel C. Steere.

"Method for Making a Write-Once Memory Device Read Compatible with a Write-Many File System," U.S. Appl. No. 10/023,468, filed Dec. 14, 2001; inventors: Christopher S. Moore, Matt Fruin, Colm Lysaght, and Roy E. Scheuerlein.

"Reed-Solomon Codes: An introduction to Reed-Solomon codes: principles, architecture an implementation," http://www.4i2i.com/reed_solomon_codes.htm, 8 pages, Mar. 9, 2001.

"TP 9.2: A 30ns 64Mb DRAM with Build-in Self-Test and Repair Function," ISSCC 92 Session 9/Non-Volatile and Dynamic Rams/Paper 9.2, 2 pages, 1992.

"64M x 8 Bit, 32M x 16 Bit NAND Flash Memory," Samsung Electronics, 39 pages, Sep. 2002.

"Exotic memories, diverse approaches," 8 pages, www.ednasia.com, Sep. 2001.

"A Vertical Leap for Microchips: Engineers have discovered a way to pack more computing power into microcircuits: build them vertically as well as horizontally," Thomas H. Lee, 8 pages, Jan. 2002.

"Three-Dimensional Memory Array and Method of Fabrication," U.S. Appl. No. 09/560,626, filed Apr. 28, 2000; inventors: Johan Knall.

Search History for U.S. Appl. No. 10/402,385, 3 pages, Nov. 17, 2004.

* cited by examiner

| XY | SP0 | SP1 | CR | CR | CR | CR | CR |
|---|---|---|---|---|---|---|---|

SubReg8

| SP1 | XY* | SP0 | CR | CR | CR | CR | CR |
|---|---|---|---|---|---|---|---|

SubReg7

| XY | SP0 | SP1 | CR | CR | CR | CR | CR |
|---|---|---|---|---|---|---|---|

SubReg6

| SP0 | SP1 | XYM | CR | CR | CR | CR | CR |
|---|---|---|---|---|---|---|---|

SubReg5

| XYM | ECC0 | ECC1 | CRM | CRM | CRM | CRM | CRM |
|---|---|---|---|---|---|---|---|

SubReg4

| SP1 | XYM | SP0 | CR | CR | CR | CR | CR |
|---|---|---|---|---|---|---|---|

SubReg3

| XY | SP0 | SP1 | CR | CR | CR | CR | CR |
|---|---|---|---|---|---|---|---|

SubReg2

| SP0 | SP1 | XY* | CR | CR | CR | CR | CR |
|---|---|---|---|---|---|---|---|

SubReg1

| XY | SP0 | SP1 | CR | CR | CR | CR | CR |
|---|---|---|---|---|---|---|---|

SubReg0

Fig. 7

| ZZ | YY | XX | RR3 | RR4 | RR5 | RR6 | RR7 |
|---|---|---|---|---|---|---|---|
| 0 | 1 | 2 | 3 | 4 | 5 | 6 | 7 | ions in the memory device can replace faulty blocks of memory (e.g., faulty bits, bytes, columns, rows, or sub-arrays) prior to shipment. To improve field-related yield, parity checking or error-correcting code ("ECC") algorithms can be used. The use of these algorithms is particularly important for once-programmable non-volatile memories (e.g., PROM) because individual memory cells cannot be programmed, tested, and then erased prior to shipment. Commonly-used ECC algorithms can correct single-bit errors and detect (but not correct) multi-bit errors. More-powerful ECC algorithms can be used to correct multi-bit errors, but the overhead of the circuitry and extra syndrome bits associated with those more-powerful algorithms may be undesirable.

METHOD AND APPARATUS FOR IMPROVING YIELD IN SEMICONDUCTOR DEVICES BY GUARANTEEING HEALTH OF REDUNDANCY INFORMATION

CROSS-REFERENCE TO RELATED APPLICATIONS

This application is a divisional of U.S. patent application Ser. No. 11/024,516, filed Dec. 28, 2004, now U.S. Pat. No. 7,277,336, which is hereby incorporated by reference.

BACKGROUND

Volatile and non-volatile memory arrays can have yield degradations due to problems occurring during manufacture of the memory array as well as during use of the memory array in the field. To improve manufacture-related yield in some memory arrays, the memory array can be tested at the factory, and redundancy circuits in the memory device can replace faulty blocks of memory (e.g., faulty bits, bytes, columns, rows, or sub-arrays) prior to shipment. To improve field-related yield, parity checking or error-correcting code ("ECC") algorithms can be used. The use of these algorithms is particularly important for once-programmable non-volatile memories (e.g., PROM) because individual memory cells cannot be programmed, tested, and then erased prior to shipment. Commonly-used ECC algorithms can correct single-bit errors and detect (but not correct) multi-bit errors. More-powerful ECC algorithms can be used to correct multi-bit errors, but the overhead of the circuitry and extra syndrome bits associated with those more-powerful algorithms may be undesirable.

SUMMARY

The present invention is defined by the following claims, and nothing in this section should be taken as a limitation on those claims.

By way of introduction, the preferred embodiments described below provide a method and apparatus for improving yield in semiconductor devices by guaranteeing health of redundancy information. In one preferred embodiment, a method of reading memory is provided comprising reading a set of memory cells indicating whether stored redundancy information is reliable and, if the set of memory cells indicates that the stored redundancy information is reliable, determining whether to read primary memory or redundant memory based on the stored redundancy information. In another preferred embodiment, a method for writing to memory is provided comprising reading a set of memory cells associated with a group of memory cells in a primary memory, the set of memory cells indicating whether data can be reliably stored in the group of memory cells in the primary memory; if the set of memory cells indicates that data can be reliably stored in the group of memory cells in the primary memory, storing data in the group of memory cells in the primary memory; and if the set of memory cells does not indicate that data can be reliably stored in the group of memory cells in the primary memory, storing data in a redundant memory. In another preferred embodiment, a method for providing memory redundancy is provided. Other preferred embodiments are provided, and each of the preferred embodiments described herein can be used alone or in combination with one another.

The preferred embodiments will now be described with reference to the attached drawings.

BRIEF DESCRIPTION OF THE DRAWINGS

FIG. 3 is an illustration of a page sub-register of a preferred embodiment.

FIG. 4 is an illustration of a sub-array of a preferred embodiment.

FIG. 6 is an illustration showing the location of spare array data in the extended sections of nine sub-registers of another preferred embodiment.

FIG. 7 is an illustration of the XY byte of a preferred embodiment.

DETAILED DESCRIPTION OF THE PRESENTLY PREFERRED EMBODIMENTS

By way of introductions, these embodiments generally relate to guaranteeing health of redundancy information in a memory device. As used herein, "redundancy information" refers to any information that indicates whether to read a primary memory or a redundant memory and can include row redundancy information and/or column redundancy information. If the redundancy information cannot be written correctly, the redundancy information may cause the wrong type of memory to be read (i.e., the primary memory instead of the redundant memory, or vice versa), and an entire page of data can be lost. One way to deal with this situation is to reject any unit that has a defect that makes a particular line in the memory array storing the redundancy information (herein referred to as "the spare array") unreadable (e.g., a wordline short). Another way to deal with this situation is to allocate a set (i.e., one or more) of memory cells (special bits referred to herein as "ZZ-bits") in the spare array that get programmed during the sort flow (i.e., the manufacture of the memory device). If the bits are successfully programmed (success is preferably defined by majority voting amongst four bits), then the redundancy information about that page is deemed good and will be accessed. If, on the other hand, the ZZ-bits are not programmed successfully, it can be assumed that the redundancy information about that page is not reliable, and the part automatically jumps to a redundant row (preferably determined by set associative addressing) and uses that redundant row as a replacement. As such, a defect in the spare array is not fatal anymore. It is projected that this scheme can increase yield by about 30%.

Figure 1:
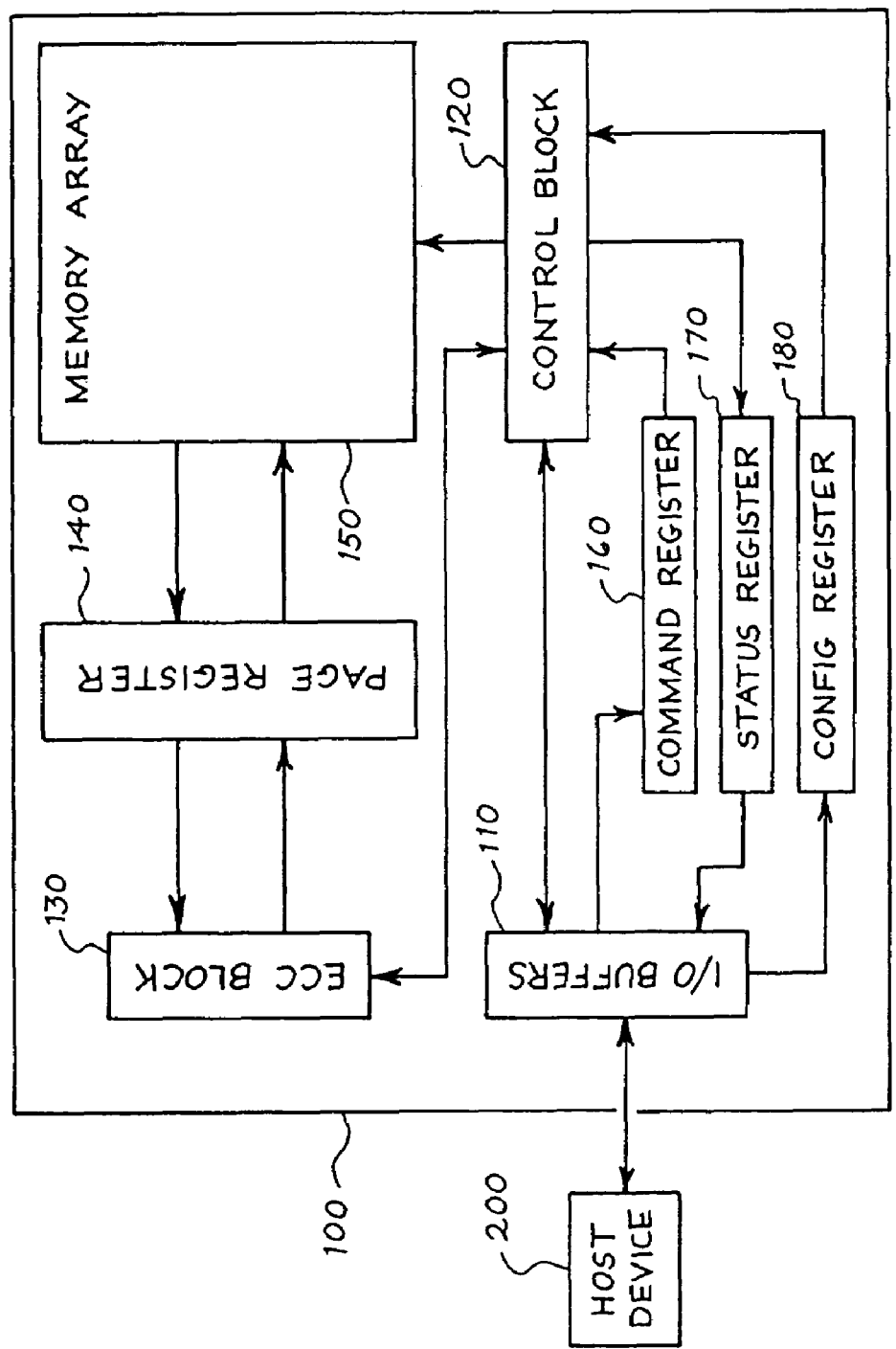
FIG. 1 is a block diagram of a memory device coupled with a host device of a preferred embodiment.

Turning now to the drawings, FIG. 1 shows a memory device 100 of a preferred embodiment coupled with a host device 200. As used herein, the term "coupled with" means directly coupled with or indirectly coupled with through one or more named or unnamed components. As shown in FIG. 1, the memory device 100 comprises I/O buffers 110, a control block 120, an ECC block 130, a page register 140, a memory array 150, a command register 160, a status register 170, and a configuration register 180. The command register 160 passes commands (e.g., read, write) received from the host device 200 to the control block 120, the status register 170 holds information from the control block 120 regarding the status of certain operations (e.g., a failure during a write operation), and the configuration register 180 can be used during a test operation to instruct the control block 120 to disable ECC syndrome bit generation.

The page register 140 is a buffer structure between the memory array 150 and a Smart Media Interface (SMI) in communication with the host device 200. In this embodiment, bits are read from and stored in the memory array 150 a page-at-a-time, and the page register 140 holds a page of memory that is going to be stored in the memory array 150. The page register 140 also holds a page of memory that is read from the memory array 150. The page register 140 is populated until it is full. In this embodiment, the contents of the page register 140 are then transferred to the memory array 150 one byte at a time. During a read operation, bytes of data are read from the memory array 150 into the page register 140 and are then serially pushed out from the SMI to the host device 200.

The memory array 150 comprises a primary memory array and a redundant memory array. In general, a set of memory cells in the redundant memory array is associated with a set of memory cells in the primary memory array such that the set of memory cells in the redundant memory array is used if there is an error in writing to the set of memory cells in the primary memory array. The primary and redundant memory arrays each comprise a plurality of memory cells. The memory cells can take any suitable form, including, but not limited to, write-once memory cells (i.e., one-time programmable), write-many memory cells, few-time programmable memory cells (i.e., memory cells that are programmable more than once but not as many times as a write-many memory cell), or any combination thereof. The memory cells can be organized in a single layer (i.e., a two-dimensional array) or in a plurality of layers stacked vertically above one another above a single silicon substrate (i.e., a three-dimensional array), as described in U.S. Pat. No. 6,034,882 to Johnson et al. and U.S. Pat. No. 6,420,215 to Knall et al., both of which are assigned to the assignee of the present invention and are hereby incorporated by reference. Examples of a set of memory cells include, but are not limited to, a row of memory cells, a column of memory cells, a page of memory cells, or a sub-array of memory cells.

The primary and redundant memory arrays can be separate arrays or can be integrated in a single memory array. Also, memory cells in the redundant memory array need not necessarily be used exclusively for redundancy. For example, a set of memory cells can be designated for redundancy for one write operation and, if not used during that write operation, can later be used as primary memory cells for a different write operation. Likewise, a set of memory cells can be designated as primary memory cells for one write operation and be used as redundant memory cells for another write operation. Also, as used herein, the term "area" refers to part or all of a memory array. Accordingly, a "primary memory area" (or simply "primary memory") can refer to the entire primary memory array or part of the primary memory array, and a "redundant memory area" (or simply "redundant memory") can refer to the entire redundant memory array or part of the redundant memory array.

In this preferred embodiment, the memory array 150 comprises a plurality of sub-arrays (or "tiles") organized in an array of 16 rows (which will be referred to herein as "stripes") and ten columns (which will be referred to herein as "bays"). As used herein, the term sub-array refers to a contiguous group of memory cells having contiguous word and bit lines generally unbroken by decoders, drivers, sense amplifiers, and input/output circuits. The arrays in the tenth column are referred to herein as "spare arrays." The spare arrays are used to store sideband data, ECC bits for the sideband data, and data used for column and row redundancy/self repair, all of which will be referred to herein as "spare data" (as compared to main data).

Figure 2:
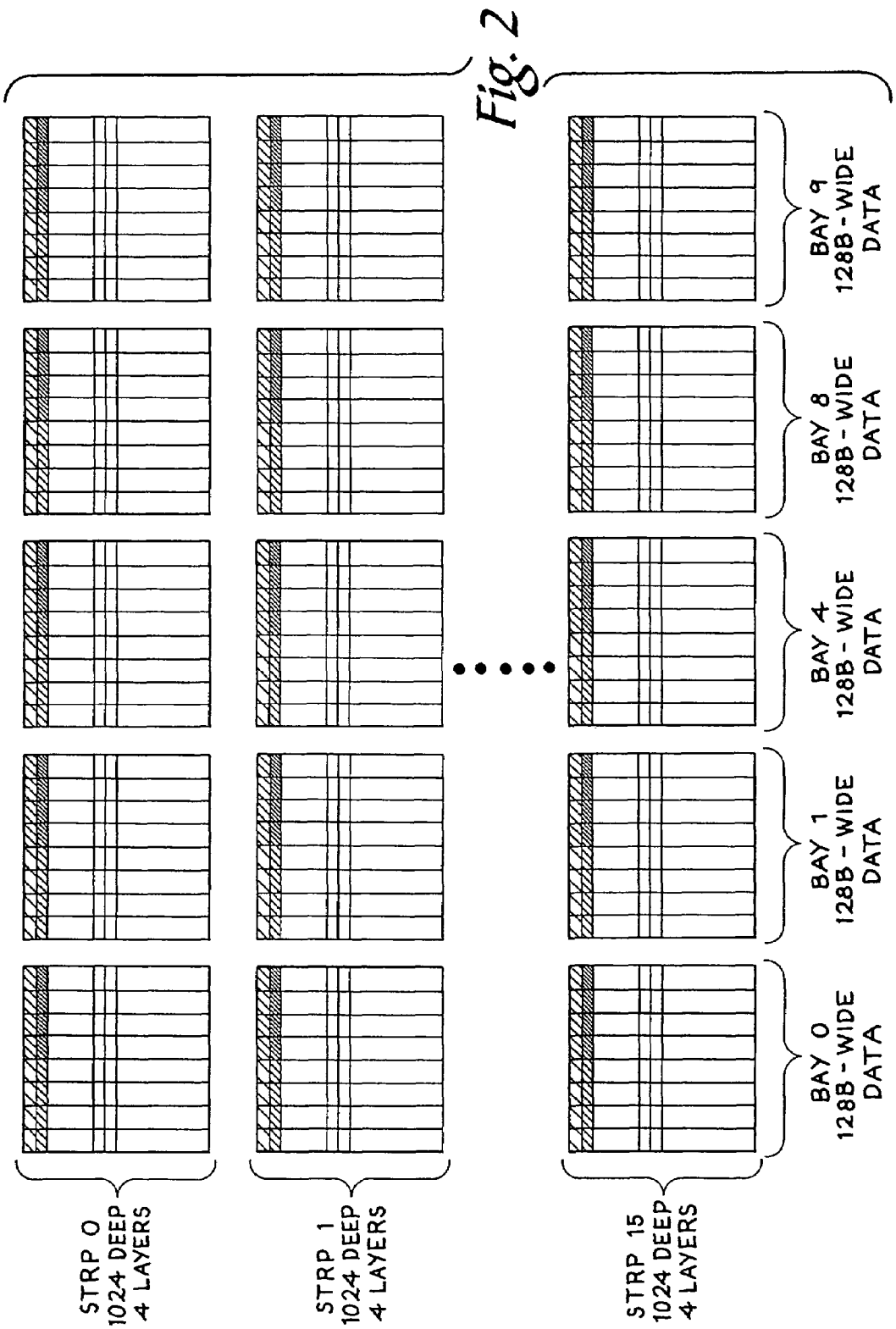
FIG. 2 is an illustration of a memory array of a preferred embodiment in which a page of memory is distributed among bays in a stripe.

In this preferred embodiment, the main data and ECC of a page are distributed among the nine sub-arrays in a stripe such that one sub-array in a stripe holds $1/9^{th}$ of the page. (The spare arrays will be discussed in more detail below.) FIG. 2 illustrates this arrangement, with different shadings used to depict different pages stored in the nine bays of each stripe. For example, for ECC word "A," bits A0-A7 would be stored in stripe 0, bay 0; bits A8-A15 would be stored in stripe 0, bay 1; etc. Likewise, for ECC word "B", bits B0-B7 would be stored in stripe 0, bay 0; bits B8-B15 would be stored in stripe 0, bay 1; etc. As shown by the shadings in FIG. 2, in this preferred embodiment, bits of a given page are located in the same location in each of the sub-arrays. To distribute a page of memory to the nine bays in a stripe, the page register 140 is preferably divided into nine identical blocks (or "sub-registers"), each of which contains page data for one of the nine sub-arrays in a stripe (i.e., $1/9^{th}$ of the page). (As described below, each sub-register can also contain page data for $1/9^{th}$ of what belongs to the spare array.)

Figures 3, 4:
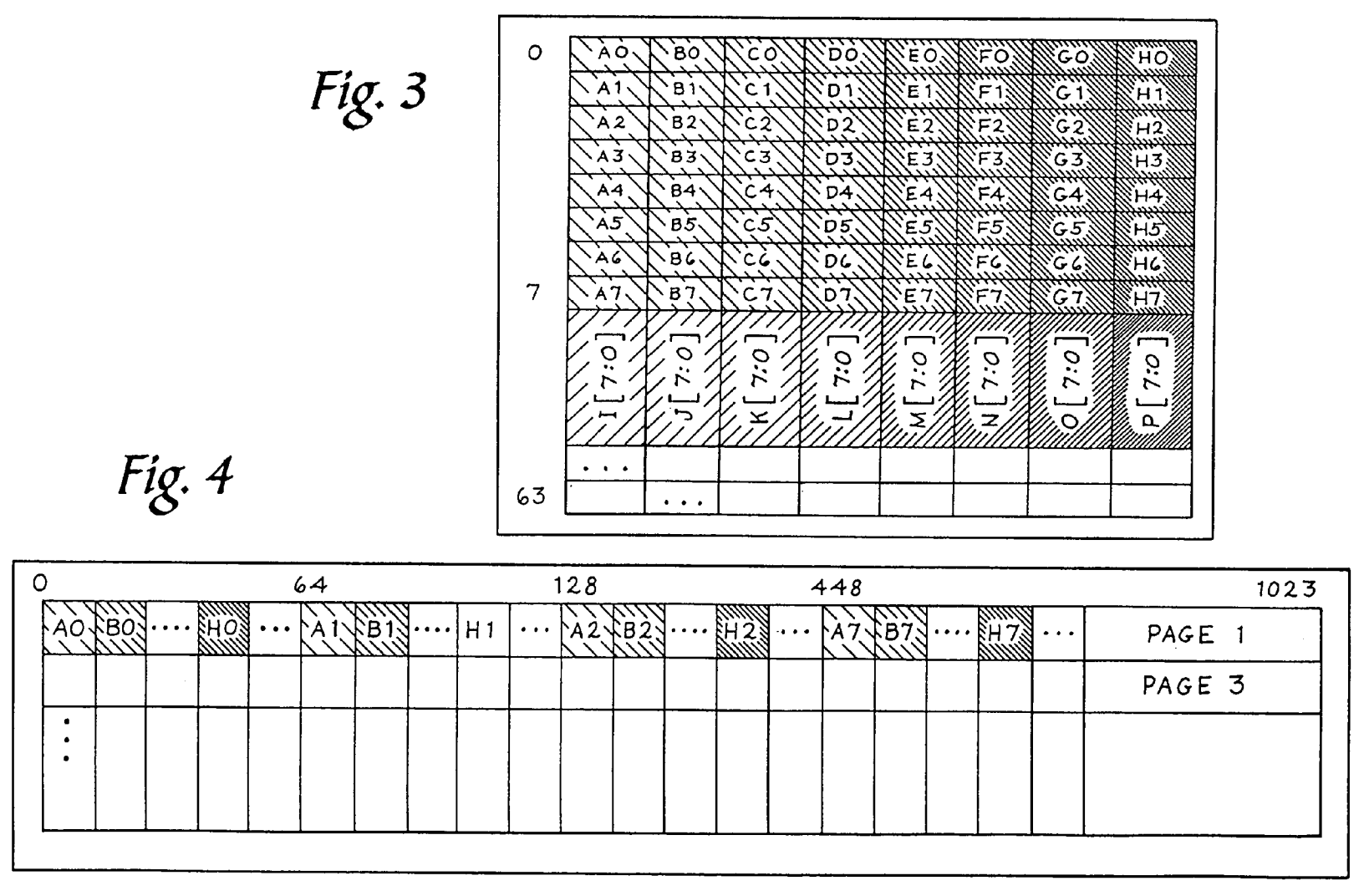

The page register 140 in this preferred embodiment incorporates bit sprinkling functionality to maximize the physical spacing between bits in a given oct-byte and, accordingly, to improve the effectiveness of the ECC protection. Further details on the bit sprinkling functionality can be found in "Memory Device and Method for Storing Bits in Non-Adjacent Storage Locations in a Memory Array," U.S. patent application Ser. No. 10/024,647, which is assigned to the assignee of the present application and is hereby incorporated by reference. While control logic is responsible for physically mapping a page into the memory array 150, data scrambling and de-scrambling in the sub-registers is enabled as a hardware feature of the page register 140 and is transparent to the control logic. Further, the SMI logic will see the data in its original form at all times. FIG. 3 is an illustration of the page sub-register for bay 0. One byte of each word in the page is stored in the page sub-register from top to bottom. For example, bits A0-A7 of ECC word A are stored in rows 0-7 of the first column, bits B0-B7 of ECC word B are stored in rows 0-7 of the second column, etc. When bits are read out of the page sub-register and into a corresponding sub-array, the bits are read from left to right (e.g., A0 B0 C0 . . . H0). The bits read from the page sub-register are then stored in the corresponding sub-array, as illustrated in FIG. 4. (Addressing of the columns is taken care of by the column decoders in the array.) As shown in FIG. 4, because the direction that the bits were stored in the page sub-register is different from the direction that the bits were read out of the page sub-register, bits in an ECC word are located in non-adjacent locations in the memory array. Specifically, each bit is 64 storage locations apart in the sub-array (e.g., A0 is 64 storage locations apart from A1), thereby achieving maximum separation between bits of an oct-byte. Accordingly, a local manufacturing defect must be large enough to extend across 65 bit locations before causing a double-bit error within an ECC word. A defect that extends across 64 bits locations will only result in a correctable single-bit error in 64 ECC words, instead of an uncorrectable multi-bit error in a single ECC word. This enhances the yield and reliability of the memory device 100 with a minimal amount of overhead and implementation cost. The same principles described above apply to storage of the ECC syndrome bits in the sub-array in bay 4.

Figure 5:
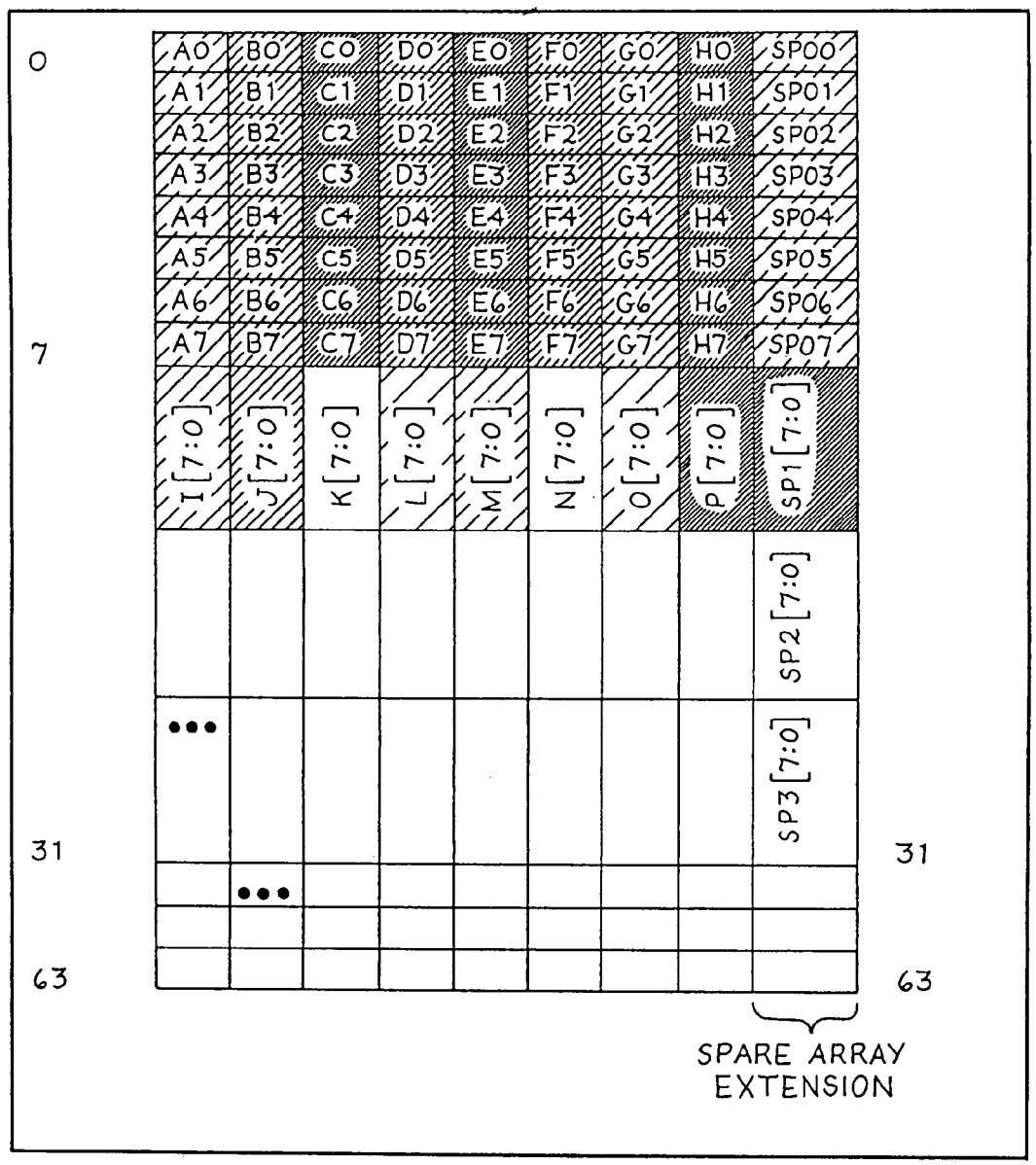
FIG. 5 is an illustration of a page sub-register of a preferred embodiment.

FIG. 5 shows a page sub-register of this embodiment in which spare array data is contained within an extended section of the sub-registers. Each row in FIG. 5 represents data as it will be written to the memory array 150. FIG. 6 shows the location of the spare array data in the extended sections of nine sub-registers. In FIG. 6, each block represents one byte of data (one bit wide and eight bits deep). SP0 and SP1 are the spare array data (16-bytes), and ECC0 and ECC1 are their respective ECC syndrome bits. XY is used to store redundancy information, and CR is used to store "bad bit pointers" and replacement data for column repairs, as described in U.S. patent application Ser. No. 10/402,385, filed Mar. 28, 2003, which is assigned to the assignee of the present invention and is hereby incorporated by reference. XYM and CRM are masked bit locations in XY and CR space, which the memory circuitry ignores. FIG. 6 shows that the XY byte is replicated into subregisters 0, 1, 2, 6, 7, and 8. However, the memory circuitry only reads the XY bytes in subregisters 0, 2, 6 and 8, looking for a majority encoding (3 of 4) of bits being the same. The XY bytes in FIG. 6 that are marked with an "*" are not used.

FIG. 7 shows the XY byte definition. The XY byte comprises eight one-bit fields: ZZ, YY, XX, RR3, RR4, RR5, RR6, and RR7. Reading the XY bytes only in subregisters 0, 2, 6 and 8 provides sufficient data redundancy while also providing a fast read of the values stored in the ZZ, XX, YY, and RR bits. Reads occur top-down in FIG. 6 and left-to-right in FIG. 7, so the YY bits in subregisters 0, 2, 6, and 8 will be read first, followed by the XX bits, then the RR3, RR4, RR5, RR6, and RR7 bits.

In the primary memory, the bits have the following meaning:

ZZ indicates that the spare array can be programmed. As described below, the ZZ bit is programmed during sort flow. If there is an error in programming the ZZ bit during sort flow, the memory area (e.g., row, column, page) comprising the ZZ bit is preferably not used to store redundancy information since the failure to successfully program the ZZ bit indicates that redundancy information cannot be reliably stored in that memory area. The redundancy information is, instead, stored in a different area in memory. (In this preferred embodiment, a direct address mapping scheme is used to identify that different area in memory.) When a memory area is subsequently accessed, the ZZ bit is read. If the ZZ bit is in the programmed state, the memory area (and, hence, the redundancy information stored in the XY bit space therein) can be assumed to be reliable. If the ZZ bit is not programmed, the circuitry in the memory device jumps to the redundant row space (via direct address mapping) and performs the read or write operation there. In this embodiment, a page is "bad" when one or more errors occur in writing to the page.

YY indicates whether or not the page is good:
YY=1: page is good (more specifically, not known to be bad).
YY=0: page is bad.
XX indicates whether or not the repair for that page was successful:
XX=1: repair operation was successful.
XX=0: repair operation failed.
The RR bits indicate which one of 32 repair pages was used for a re-map in the case where a page was bad (YY=0) and a repair succeeded (XX=1). This address tag is used because, unlike the previously-described embodiment which uses a direct-mapped architecture and does not need to store address information, this preferred embodiment uses a fully-associative repair architecture.

With a direct-mapped repair scheme, depending on the number of repair rows available, multiple pages would share or be mapped to a single redundant row. In the case of two or more of these rows needing repair, there would be a conflict, and a repair would not be successful. The design associated with direct-mapped repair is simple since no address cycling and storage is necessary. However, fully-associative repair is far superior in terms of yield since more normal rows can be repaired before exhausting the available set of repair rows. In a presently preferred embodiment, each ½ MB tile contains 32 repair rows per layer. This translates to a total of 64 available repair pages per stripe per layer. As described in earlier sections, to improve ECC coverage, a page is written across all of the tiles in a stripe. Essentially, each tile gets a different 64B piece of a page. In this embodiment, when a row is repaired, the same logical row is preferably replaced in all tiles in the stripe even though at a minimum only one of them was deemed bad. This design simplifies the address and repair signal routing to each bay while still providing excellent repair coverage. Each ½ MB tile contains 1024 user rows per layer, requiring 10 row address bits (RAD[9:0]) to uniquely decode 1 line. Addressing the 32 repair rows simply uses the five least significant bits from this address field along with a REPAIR signal. When REPAIR is asserted, the main array rows are deselected, and RAD[4:0] are used to select one of 32 available rows. Because any one main row could be mapped to one of 32 repair rows, the repaired page preferably stores the five-bit repair row address along with the ZZ, XX, and YY redundancy information. This storage occurs in the XY byte (described above). The mapping is RAD[4:0]=RR[7:3]. If a repair operation is initiated when all 32 repair rows are used, the memory control circuitry preferably will discover that after reading the YY bit in each of the 32 repair rows in that stripe. It will then preferably abort the repair and update the status register that the write operation failed.

On the initial attempt to write a repair row, should the repair fail, the memory control circuitry will preferably try the next repair row. However, once a repair has been successful (and marked in the XX, YY, and RR bits), the memory control circuitry cannot attempt additional repair rows for that original row in this particular implementation. In subsequent writes to an already repaired row, the memory control circuitry will re-write the XX, YY, and ZZ bits in the repair row with four copies of each bit.

XX and YY bits are also used in a repair row in the redundant memory, but their usage is slightly different.
YY indicates whether or not the repair row is used:
YY=1: repair row is available (i.e. not used).
YY=0: repair row is used.
XX indicates whether or not the write to that repair row was successful:
XX=1: repair operation was successful.
XX=0: repair operation failed.
It should be noted that, in this embodiment, when a repair page fails the first time it is created, the X bits in the main page are set to 0. Once a repair page has been successfully written, from that point on, if the repair page fails, then the X bits in the repair page are set to 0.

It should be noted that using a virgin state (here, logic 1) as a default ensures that information about the health of a row is provided irrespective of whether the memory cell can be programmed. A healthy row is indicated when the ZZ bits are read as being in the programmed state. An unhealthy row is indicated when the ZZ bits are read as being in the virgin state.

Figure 8:
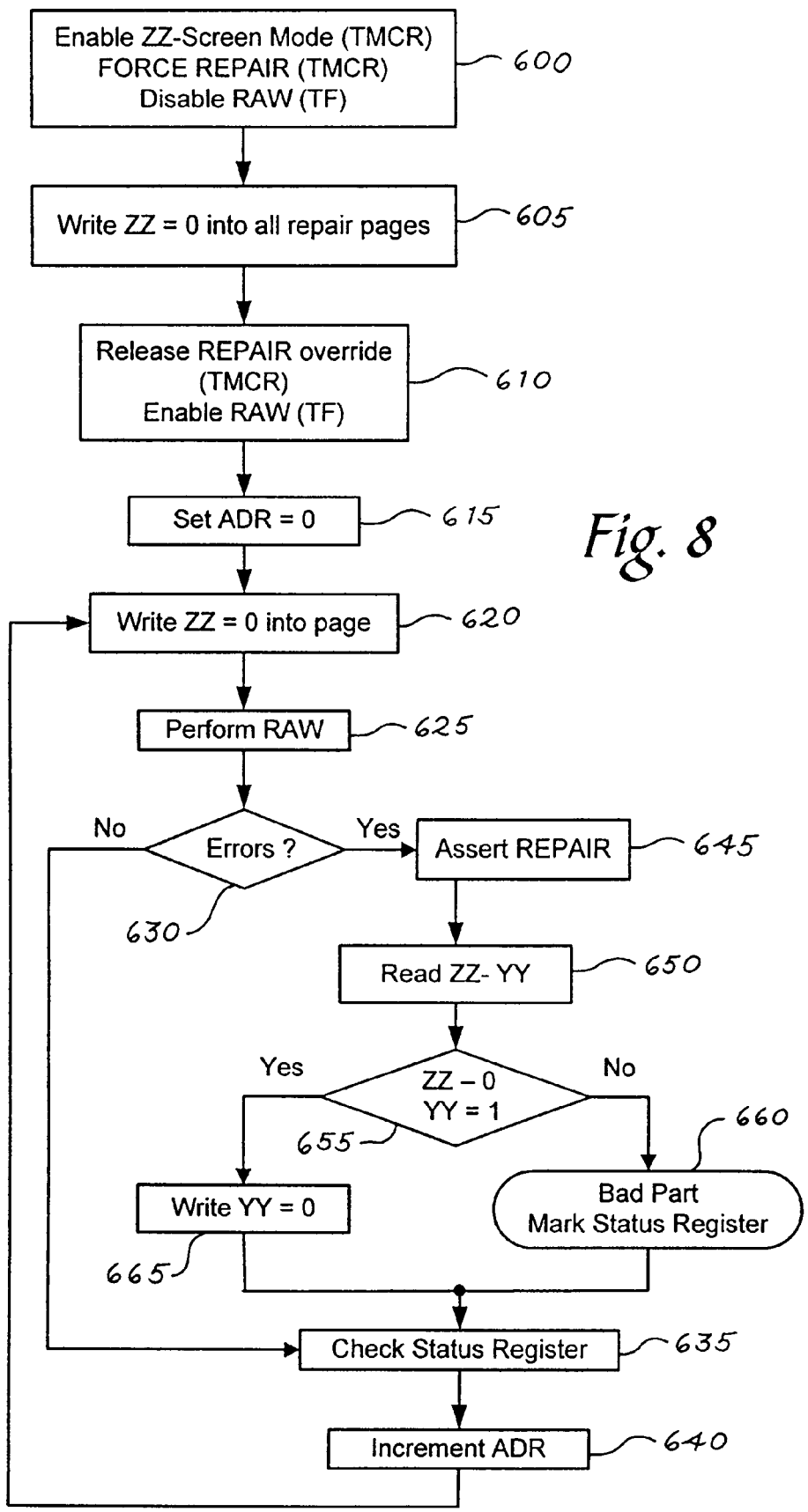
FIG. 8 is a flow chart illustrating programming of ZZ bits of a preferred embodiment.

Returning to the drawings, FIG. 8 is a flow chart illustrating the programming of ZZ bits. As discussed above, ZZ bit programming is the first step in the sort flow of this embodiment and identifies pages with bad ZZ-bits and automatically reserves redundant pages for future use. Programming is performed in two steps. First, the redundant memory area is programmed, and then the main memory area is programmed. If the programming of the ZZ bits in the redundant memory area fails, the redundant memory area is deemed to be unusable. (If the redundant memory area is deemed to be unusable, it is only that area—not the redundant memory array—that is deemed unusable. The part need not be thrown away.) If the programming of the ZZ bits in the main memory area fails, a redundant row with successfully-programmed ZZ bits is allocated for that failed main memory area. This will be described in more detail with reference to FIG. 9.

Turning now to the flowchart, first, the memory is prepared by enabling a ZZ-screen mode, asserting a force repair signal, and disabling a read-after-write (RAW) feature (act 600). Asserting the force repair signal causes subsequent writes to occur only in the redundant memory and not in the primary memory, and disabling the read-after-write (RAW) feature allows the ZZ bits to be quickly programmed in the redundant memory. Next, the ZZ bits are programmed into all repair pages in the redundant memory (act 605). With the programming completed, the repair signal is released (so subsequent writes will occur in the primary memory), and the read-after-write feature is enabled (act 610). The address register is then set to zero (act 615), and the ZZ bit is programmed into the page at that address (act 620). A read-after-write operation is performed (act 625), and it is determined if an error occurred in writing the ZZ bits for that page (act 630). If no error occurred, the status register is checked (act 635), the address register is incremented (act 640), and the above procedure is repeated. If there is an error, a repair signal is asserted (act 645), which causes the memory controller to point to an address in redundant memory that is directly mapped from the address in the primary memory where the ZZ bit was unsuccessfully programmed. The ZZ and YY bits are read from this redundant memory area (act 650), and it is determined if ZZ=0 and YY=1 (act 655). ZZ=0 when the ZZ bit for that redundant area was programmed successfully (indicating that the redundancy information is reliable), and YY=1 when the redundant area is still free. Accordingly, ZZ=0 and YY=1 when the redundant area is both healthy and unused. If both of those conditions are not true, the part is bad, and the status register is marked accordingly (act 660). In contrast, if both conditions are true, the YY bit in the repair row is programmed to indicate that the repair row will be used (act 665).

More generally, during sort flow of a memory device, an attempt is made to program a set of memory cells (e.g., the ZZ bits) in a redundant memory area (e.g., row). An attempt is also made to program a set of memory cells (e.g., the ZZ bits) in a main memory area associated (e.g., in a directed mapped fashion) with the redundant memory area. If the set of memory cells in the main memory area are not programmed successfully, it is determined whether the set of memory cells in the redundant area were programmed successfully. If the set of memory cells in the redundant area were programmed successfully and the redundant area is not allocated to another main memory area, the redundant area is allocated for the main memory area (e.g., by programming the YY bit). If the set of memory cells in the redundant area were not programmed successfully or the redundant area was allocated to another main memory area, the memory device is discarded.

Figure 9:
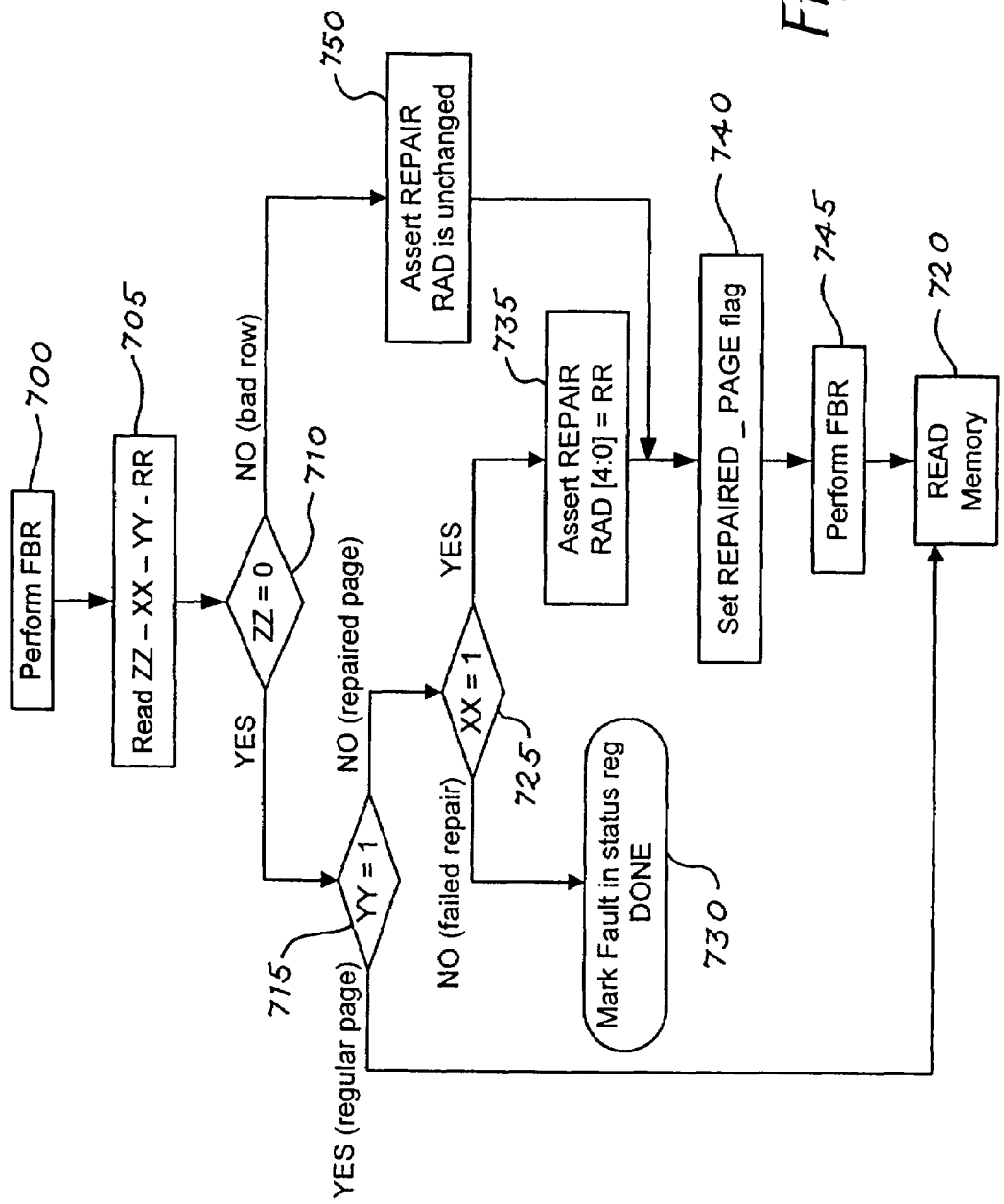
FIG. 9 is a flow chart illustrating a read operation of a preferred embodiment.

Turning again to the drawings, FIG. 9 is a flow chart illustrating a read operation. First, a "fill before read" (FBR) operation is performed to repair any bad columns in the primary memory (act 700). Preferably, this involves using the column repair scheme described in U.S. patent application Ser. No. 10/402,385, filed Mar. 28, 2003, which is assigned to the assignee of the present invention and is hereby incorporated by reference. Next, the ZZ, YY, XX, and RR bits are read (act 705), and it is determined whether the stored redundancy information (the YY, XX, and RR bits) is reliable by determining if the ZZ bit was successfully programmed (at 710). If the ZZ bit was successfully programmed, it is then determined if the YY bit is in the unprogrammed state, which would indicate that no repairs were made to the page (act 715). In that event, the memory is read at the given address (act 720). If the YY bit is in the programmed state, indicating that a repair was made to the page, it is determined if the repair was successful by checking whether the XX bit is programmed (act 725). If the XX bit is programmed (indicating a failed repair), a fault is marked in the status register (act 730). If the XX bit is not programmed, the repair signal is asserted, and the address specified by the RR bits is loaded into the address register (act 735). After a repair flag is set (act 740) and a column repair operation is performed (act 745), the redundant memory is read at the address specified by the RR bits (act 720). Returning back to act (710), if the ZZ bit is not programmed (indicating a bad row), the repair signal is asserted, and the row address is not changed (act 750). A direct map address is then identified, and the memory is read at that address (act 720).

Figure 10:
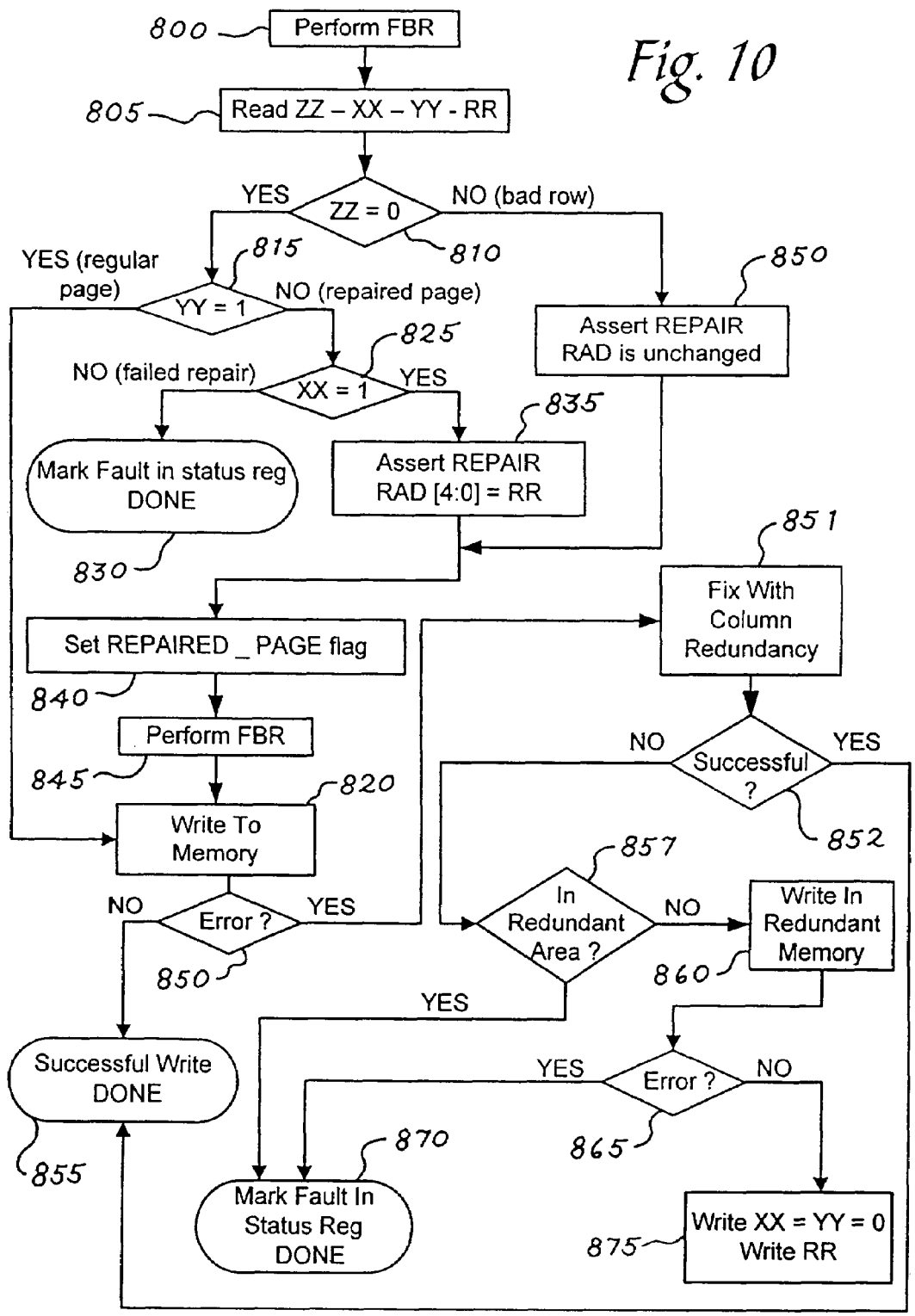
FIG. 10 is a flow chart illustrating a write operation of a preferred embodiment.

A write operation will now be described in conjunction with FIG. 10. Acts 800-845 are similar to acts 700-745 in the read operation shown in FIG. 9. Act 820, however, is write to memory, whereas act 720 is read memory. After the memory is written, it is determined whether an error occurred, such as by using a read-after-write operation (act 850). If no error occurred, the write was successfully performed (act 855). If an error occurred, an attempt is made to fix the error using the column redundancy scheme mentioned above (act 851), and it is determined whether the attempt was successful (act 852). If the attempt was successful, the write operation is successful (act 855). If the attempt was unsuccessful, it is determined whether the write was in the redundant area (act 857). If the write was in the redundant area, a fault is marked in the status register (act 870). Otherwise, the data is written into redundant memory (act 860), and it is determined whether that write was successful (act 865). If the write was not successful, a fault is marked in the status register (act 870). If the write was successful, the XX and YY bits are programmed (to indicate that the area in the redundant memory is used and was successfully written to), and the address of area in the redundant memory is written in the RR bits (act 875).

There are several alternatives that can be used with this embodiment. For example, while the redundancy information was stored in a separate memory array in this embodiment, redundancy information can be stored in the same memory array as the main/primary memory or the redundant memory. As another example, instead of programming the ZZ bits during sort flow, the ZZ bits can be programmed in the field. Also, the redundancy/self-repair operations described in U.S. patent application Ser. No. 10/024,646, which is assigned to the assignee of the present invention and is hereby incorporated be reference, can be used in conjunction with the embodiment described herein.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for reading memory, the method comprising:
    (a) reading a set of memory cells in an area of memory that stores redundancy information for a group of memory cells in a primary memory, the set of memory cells indicating whether the area of memory is able to reliably store redundancy information; and
    (b) if the set of memory cells indicates that the area of memory is able to reliably store redundancy information:
        reading the redundancy information; and
        determining whether to read the primary memory or a redundant memory based on the redundancy information;
    wherein the redundancy information comprises a first field for storing an indication of whether the redundant memory was written to, a second field for storing an indication of whether a write operation to the redundant memory was successful, and a third field for storing an address in the redundant memory.

2. The method of claim 1 further comprising:
    (c) if the set of memory cells does not indicate that the area of memory is able to reliably store redundancy information, reading an address of the redundant memory identified by a direct mapping operation from an address associated with the set of memory cells.

3. The method of claim 1 wherein (b) comprises reading the primary memory if the first field does not store an indication that the redundancy memory was written to.

4. The method of claim a 1, wherein (b) comprises reading the redundant memory at the address stored in the third field if the first field stores an indication that the redundant memory was written to and the second field stores an indication that a write operation to the redundant memory was successful.

5. The method of claim 1, wherein the set of memory cells indicates that the the area of memory is able to reliably store redundancy information when the set of memory cells is in a programmed state.

6. The method of claim 1, wherein the redundancy information comprises row redundancy information.

7. The method of claim 1, wherein the redundancy information comprises column redundancy information.

8. The method of claim 1, wherein the memory cells are part of a three-dimensional memory array comprising a plurality of layers of memory cells vertically stacked over a silicon substrate.

9. A method for reading memory, the method comprising:
    (a) reading a set of memory cells indicating whether stored redundancy information is reliable; and
    (b) if the set of memory cells indicates that the stored redundancy information is reliable, determining whether to read primary memory or redundant memory based on the stored redundancy information;
    wherein the redundancy information comprises a first field for storing an indication of whether the redundant memory was written to, a second field for storing an indication of whether a write operation to the redundant memory was successful, and a third field for storing an address in the redundant memory; and
    wherein (b) comprises generating an error if the first field stores an indication that the redundant memory was written to and the second field does not store an indication that a write operation to the redundant memory was successful.

* * * * *